United States Patent [19]

Nakazawa et al.

[11] 4,306,186
[45] Dec. 15, 1981

[54] FREQUENCY MARKER DISPLAY SYSTEM

[75] Inventors: Yoshimi Nakazawa; Etsuji Mesuda, both of Tokyo, Japan

[73] Assignee: Anritsu Electric Company Limited, Tokyo, Japan

[21] Appl. No.: 135,710

[22] Filed: Mar. 31, 1980

[30] Foreign Application Priority Data

Mar. 31, 1979 [JP] Japan .................................. 54-37745

[51] Int. Cl.$^3$ ............................................. G01R 23/16
[52] U.S. Cl. .................................. 324/77 B; 324/77 C
[58] Field of Search ................. 324/77 R, 77 B, 77 C, 324/77 CS; 364/485

[56] References Cited

U.S. PATENT DOCUMENTS

| | | | |
|---|---|---|---|
| 3,304,494 | 2/1967 | Palatinus | 324/77 CS |
| 3,360,724 | 12/1967 | Guros et al. | 324/77 CS |
| 3,771,061 | 11/1973 | Bayer | 324/77 C |
| 3,876,946 | 4/1975 | La Clair | 324/77 CS |

Primary Examiner—Michael J. Tokar
Attorney, Agent, or Firm—Holman & Stern

[57] ABSTRACT

A frequency marker display system for displaying markers on a display device such as a cathode ray tube includes means for generating gating pulses whereby only a desired pair of frequency markers, appearing on each side of a center frequency marker, are displayed. Selection of the side frequency markers is accomplished by an operator-actuated switch which produces a DC signal, this DC signal being compared with the level of a sweep repetition rate controlling signal, and said gating pulses are produced when the levels of said DC signal and that of said sweep repetition rate controlling signal coincide.

3 Claims, 8 Drawing Figures

FREQUENCY MARKER DISPLAY SYSTEM

BACKGROUND OF THE INVENTION

It is frequently necessary to provide a clear indication of the instantaneous value of the frequency of a signal produced by a sweep signal generator. Such a generator produces a signal whose frequency varies in a repetitive, periodic manner. The frequency variation may occur in a sinusoidal manner with time, for example, sweeping alternately above and below a predetermined center frequency value. A common method of indicating the frequency variation of such a signal is by means of a series of frequency markers on a cathode ray tube display, arrayed in line, with the spacing between successive markers indicating equal increments of frequency. It the sweep signal is displayed on the same cathode ray tube, then it is possible to determine the frequency of the sweep signal at any point in its progress from a minimum frequency value to a maximum frequency value, by observing the relationships between the frequency markers and the displayed sweep signal. In prior art embodiments of such frequency marker systems, a large number of markers are simultaneously displayed. It is therefore difficult to determine rapidly the actual value of frequency to which a particular marker corresponds.

With the present invention, this difficulty which is encountered with such prior art frequency marker systems is eliminated by providing means whereby a particular frequency marker, or pair of frequency marker symmetrically disposed with respect to the center frequency marker, can be immediately selected by an operator, through actuation of a switch. Since this switch may be provided with indications which show the frequency value for each of the frequency markers selected at each setting of the switch, it is apparent that selection of a particular frequency marker, or determination of the frequency of the closest frequency marker to a particular portion of the swept signal, can be readily achieved by the present invention. In addition, the present invention can be readily implemented by relatively simple modification of a frequency marker system of conventional design.

SUMMARY OF THE INVENTION

The present invention comprises a frequency marker display system for a sweep signal generator, whereby a particular one, or particular pair, of frequency markers, displaced in frequency with respect to a center frequency marker, may be displayed upon a display device such as a cathode ray tube display. Selection is performed by setting a selector switch to one of a number of different positions, thereby producing a DC output voltage of predetermined amplitude. A sweep repetition signal oscillator produces an output signal whose amplitude varies periodically and this sweep repetition signal is applied to a sweep signal oscillator, which will normally comprise a voltage controlled oscillator. The frequency of an output signal from this sweep signal oscillator is controlled in accordance with the amplitude of the sweep repetition signal, and therefore is periodically swept between a minimum value and a maximum value, with the sweep signal frequency varying with time in correspondance with the variation of the sweep repetition signal amplitude with time. A comparator detects coincidence between the amplitude of the sweep repetition signal and that of the selector signal from the selector switch, and produces a control signal, in the form of a brief pulse. This control pulse enables a side frequency marker to be displayed on the display device, while at all other times, frequency markers other than that for the center frequency, are inhibited from being so displayed. Since the control pulse timing corresponds to a particular predetermined amplitude of the sweep repetition signal, the frequency of the sweep signal at the time of generation of the control pulse is known, and hence the frequency of the marker which is enabled to be displayed by that control pulse timing, i.e. by that particular setting of the selector switch, is known. The present invention therefore enables an operator to select a particular frequency marker, or pair of frequency markers on either side of a center frequency marker, to be displayed, with the frequency indicated by the selected frequency markers being known.

DESCRIPTION OF THE PREFERRED EMBODIMENT

In the following description, it should be noted that the term "sweep signal" refers to a signal whose frequency is periodically swept through a predetermined range, while the term "sweep repetition signal" refers to a signal which is applied to a circuit generating a sweep signal, in order to control the variation in frequency of the sweep signal.

It should also be noted that although in the following description of frequency marker display systems according to the prior art and according to the present invention it is assumed that the display device whereby frequency markers are displayed comprises a cathode ray tube display, it is equally possible to utilize other types of display device for this purpose.

Figure 1:
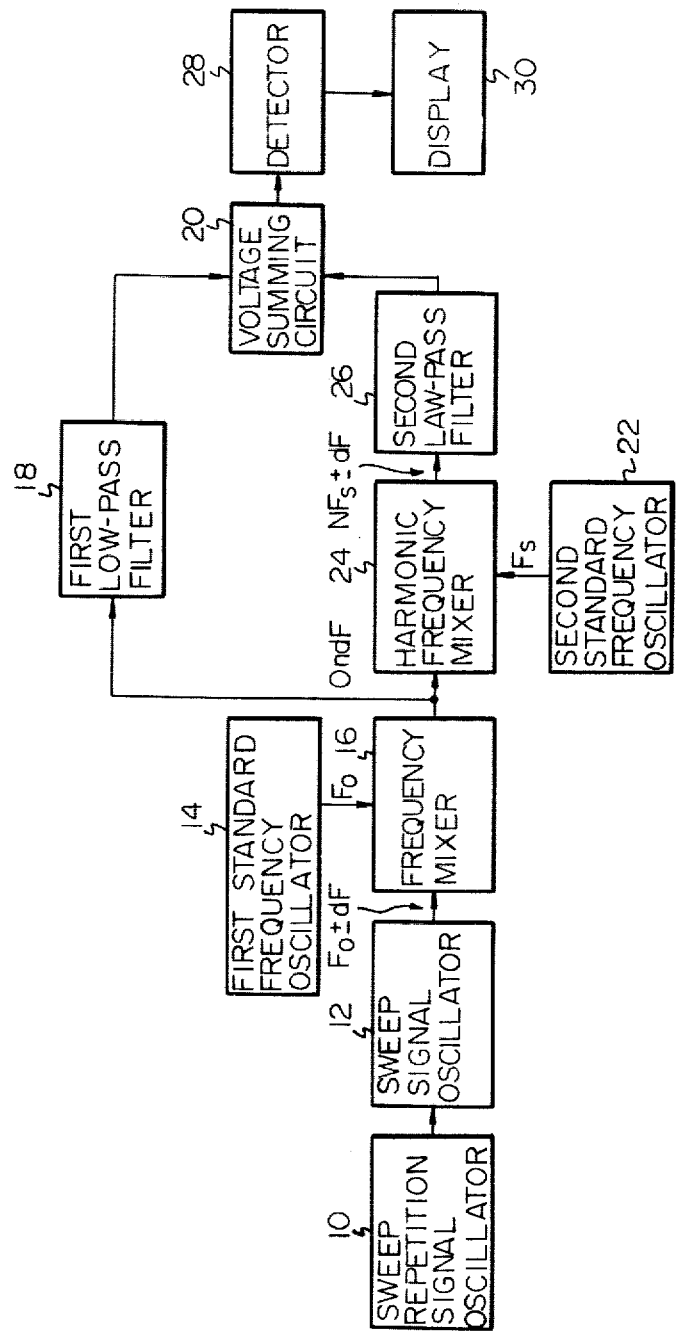
FIG. 1 is a block diagram illustrating a prior art type of frequency marker display system, in which a large number of frequency markers are simultaneously displayed.

FIG. 1 illustrates a typical embodiment of a prior art type of frequency marker display system, in simplified block diagram form. Numeral 10 denotes a sweep repetition signal oscillator circuit, which generates a sweep repetition signal, a parameter of which varies in a repetitive periodic manner within predetermined limits. This sweep repetition signal is applied to a sweep signal oscillator 12, which is controlled by the sweep repetition signal to produce a sweep signal, the frequency of which varies in a periodic manner in accordance with the sweep repetition signal. The sweep signal oscillator 12 will normally comprise a voltage-controlled oscillator, while the sweep repetition signal will in this case comprise a signal whose amplitude varies in a periodic manner, such as in a sinusoidal manner. In response to the sweep repetition signal, the frequency of the sweep signal varies about a center frequency, denoted herein as $F_o$, between a maximum frequency which is higher than $F_o$ by an amount $+dF$ and a minimum frequency which is lower than $F_o$ by an amount $-dF$.

Numeral 14 denotes a first standard frequency oscillator, which produces an output signal having the center frequency $F_o$. This output signal is combined with the sweep signal in a frequency mixer 16. Since the frequency of the sweep signal is ($F_o \pm dF$), the output signal from frequency mixer 16 will contain a low frequency component of value $F_o - (F_o \pm dF)$, in other words with a frequency which varies between zero and $\pm dF$. Thus, the frequency of the output from mixer 16 periodically attains a value of zero, and this condition is detected by means of a first low-pass filter 18, which produces an output pulse in response. It will be apparent that this output signal from first low-pass filter 18 is generated at the instant when the frequency of the sweep signal reaches a value of zero.

Numeral 24 denotes a harmonic frequency mixer, and numeral 22 a second standard frequency oscillator circuit. The term "harmonic frequency mixer" as used herein refers to a frequency mixer circuit which produces an output signal comprising the sum and difference frequencies between one input signal, the fundamental frequency of a second input signal, and a plurality of harmonic of at least one of the first and second input signal. Here, the frequency of second standard frequency oscillator circuit 22 is determined such as to be equal to the frequency spacing which is desired between a number of side frequency markers. If the frequency of the output signal from oscillator 22 is denoted as Fs, then since the frequency of the output signal from frequency mixer 16 varies periodically from zero to dF, harmonic frequency mixer 24 has a frequency which can be denoted as $N \cdot Fs \pm dF$, where N is the number of a harmonic of signal Fs. As the frequency of the output signal from mixer 16 varies from zero to dF, it successively becomes identical to the frequency of successive harmonics of signal Fs, so that the frequency of the output signal from harmonic frequency mixer 24 successively attains a value of zero, i.e. a "zero beat" condition. This is detected by means of a low-pass filter 26, which produces an output pulse each time this zero-frequency condition occurs, i.e. in periodic frequency increments which are regularly spaced apart by a value equal to Fs.

The output signals from first and second low-pass filters 18 and 26 are combined in a voltage summing circuit 20, which produces an output pulse when an output is produced from either of first and second low-pass filters 18 and 26. The output pulses from the voltage summing circuit 20 are applied through a detector 28 to a cathode ray tube display 30. As the trace on the cathode ray tube is swept across the screen, the signals from voltage summing circuit 20 cause a number of side frequency markers to be displayed, on either side of a marker which indicates the center frequency $F_o$.

Figure 2:
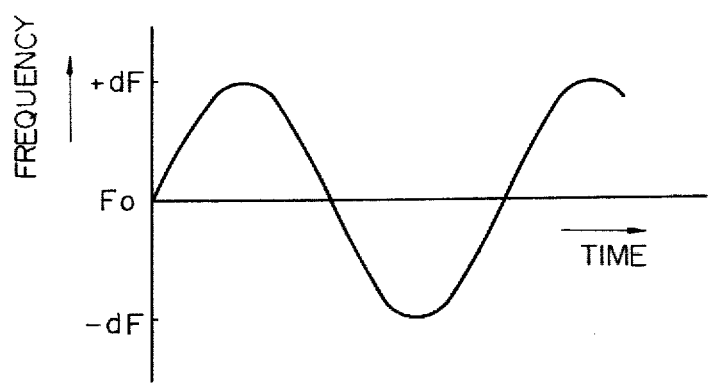
FIG. 2 is a waveform diagram illustrating a typical variation of frequency with time for the frequency marker display system of FIG. 1.

FIG. 2 illustrates the manner in which the frequency of the sweep signal varies with time, in this case in a sinusoidal manner.

Figure 3:
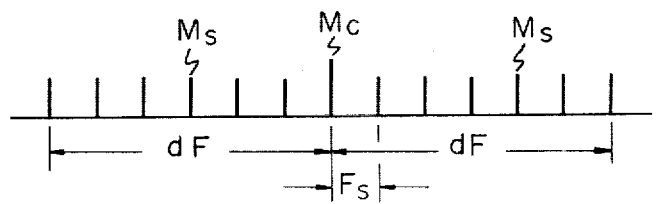
FIG. 3 is a diagram illustrating a frequency marker display as produced by a prior art frequency marker display system such as that of FIG. 1.

FIG. 3 is an example of the appearance of the frequency marker display provided by a conventional frequency marker display system. A center frequency marker Mc indicates the frequency $F_o$ of first standard frequency oscillator 14. Side markers Ms are provided on either side of marker Mc, with an identical spacing between adjacent pairs of markers, this spacing corresponding to the frequency Fs of second standard frequency oscillator 22. If, for example, the operating frequency Fs is 1 MHz, then the spacing between adjacent markers will be 1 MHz. The amplitude of the center frequency marker may be made larger than that of the side markers, as shown in FIG. 3. This can be accomplished by providing a level adjusting circuit between first low-pass filter 18 and the voltage summing circuit 20.

Such a frequency marker display system has the disadvantage that it is difficult to identify the frequency indicated by a particular marker, due to the large number of markers. This disadvantage is overcome by the present invention.

Figure 4:
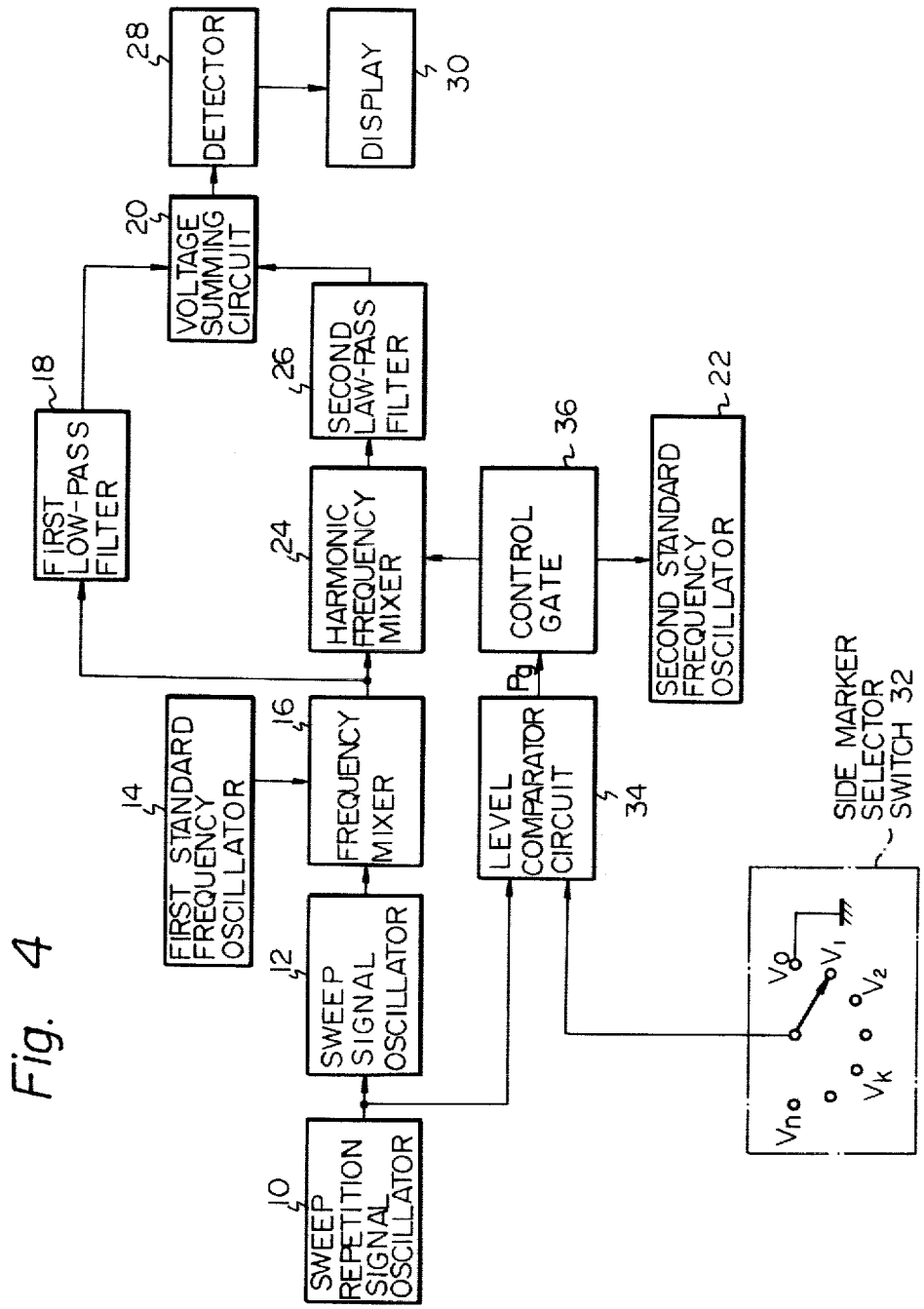
FIG. 4 is a simplified block diagram illustrating the principles of a frequency marker display system according to the present invention.
Figure 5:
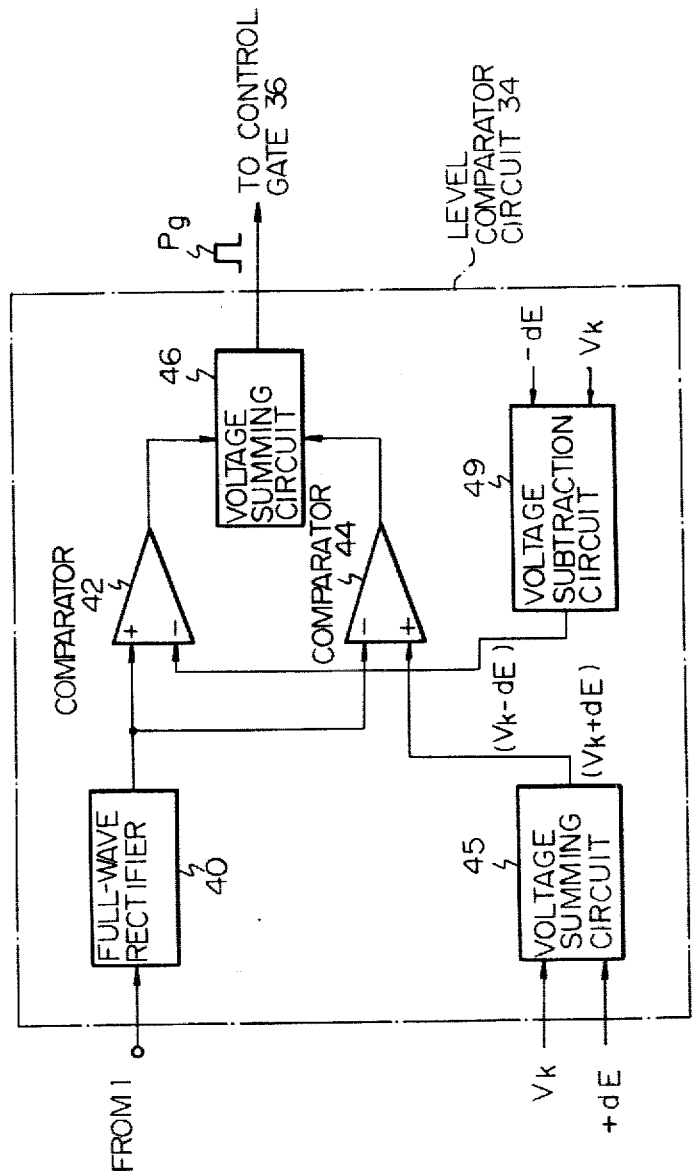
FIG. 5 is a block diagram illustrating in greater detail a level comparator circuit in the embodiment of FIG. 4.

A first embodiment of a frequency marker system according to the present invention is shown in FIG. 4, in block diagram form. In FIG. 4, circuit blocks which perform an identical function to circuit blocks shown in the prior art example of FIG. 1 are denoted by reference numbers corresponding to those of FIG. 1. Numeral 32 denotes a side marker selector switch, which can be set to produce any of a number of DC voltage levels, designated as $V_0, V_1, V_2, \ldots V_k \ldots$ to $V_n$. The side marker voltage selector switch may be provided with a dial having frequency indications thereon, to indicate to the operator the side marker frequencies which can be selected at each setting of the switch 32. Each of the selector voltage levels $V_0$ to $V_n$ produced by side marker selector switch 32 corresponds to a level of the sweep repetition signal from sweep repetition signal oscillator 10 at which the sweep signal produced by sweep signal oscillator 12 has a frequency equal to that of one of the side marker frequencies. A level comparator circuit 34 compares the level of the selector signal with that of the sweep repetition signal, and produces an output pulse when the levels coincide. If a pair of side frequency markers are to be selected from each setting of the side marker selector switch 32, then the level comparator circuit is arranged to compare the level of the selector signal with the absolute value of the level of the sweep repetition signal, with a potential midway between the maximum and minimum potential levels of the sweep repetition signal being taken as a reference zero level. This point will be made more clear by reference to the embodiment of a level comparator circuit which is shown in FIG. 5. Here, numeral 40 denotes a full-wave rectifier circuit, which receives the sweep repetition signal from sweep repetition signal oscillator 10, and whose output is coupled to a non-inverting input of a first comparator 42 and to an inverting input of a second comparator 44. In the following description, it should be noted that the term "inverting input" and "non-inverting input" have the meaning that, when the input signal applied to the inverting input of a comparator is higher in level than the input signal applied to the non-inverting input, the output signal from the comparator goes to a low potential. While, when the input signal applied to the inverting input of a comparator is lower in level than that applied to the non-inverting input, the output signal from the comparator goes to a high potential. In FIG. 5, a non-inverting input of a comparator is indicated by a "+" symbol, and an inverting input is indicated by a "−" symbol. Numeral 45 denotes a voltage summing circuit which adds a voltage increment denoted as dE to the level of the selector signal produced by side marker selector switch 32, the level of which is designated as Vk, whereby voltage summing circuit 45 produces an output signal of level (Vk+dE). This signal is applied to the non-inverting input of comparator 44. Numeral 49 denotes a voltage subtraction circuit, which subtract a voltage increment dE (equal to that added by circuit 45) from switch signal level Vk, thereby producing an output signal of level (Vk−dE), which is applied to the inverting input of first comparator 42. The output signals from comparators 42 and 44 are input to a logic circuit 46, which produces an output at the high potential level only while both of the outputs from comparators 42 and 44 are at the high potential level, and produces an output at the low potential level at any other time. In other words, circuit 46 performs a logical AND function with respect to the output signals from comparators 42 and 44.

Figure 6:
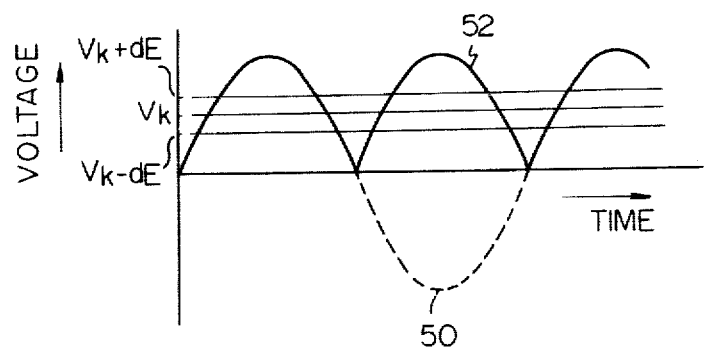
FIG. 6 is a waveform diagram illustrating the operation of the circuit of FIG. 5.

The operation of the circuit of FIG. 5 may be more readily understood with reference to the waveform diagram of FIG. 6, in which the output signal produced by full-wave rectifier 40 is shown, for the case in which the sweep repetition signal has a sinusoidal waveform. As shown, alternate half-cycles of the sweep repetition signal are inverted, as indicated by reference numerals 50 and 52. As the potential of the sweep repetition signal increases from a minimum level (i.e. reference zero potential) it eventually coincides with the level (Vk−dE). At this moment, the output of comparator 42 goes from the low potential to the high potential. At this time, since the level of the sweep repetition signal is still below (Vk+dE), the output of comparator 44 is at the high potential level. The output from logic circuit 46 therefore goes from the low to the high potential level. Subsequently, the level of the sweep repetition signal reaches the level (Vk+dE), whereupon the output of comparator 42 goes from the high to the low potential level, although the output of comparator 44 is still at the high potential level. As a result, the output of logic circuit 46 returns to the low potential level at this time. A similar process subsequently occurs when the sweep repetition signal amplitude subsequently falls below the level (Vk+dE). In this way, a pulse is produced by logic circuit 46, designated as gate pulse Pg in FIG. 5, during each of the time intervals in which the level of the sweep repetition signal is within the range (Vk+dE) to (Vk−dE). The duration of a gate pulse Pg therefore overlaps the duration of a side marker signal produced by second low pass filter 26 at a time corresponding to the level of the selector signal, i.e. level Vk. As shown in FIG. 4, the gate pulse Pg is applied to a control input of a control gate circuit 36, which is enabled to pass the output signal from oscillator 22 to harmonic frequency mixer 24 while gate pulse Pg is at the high potential level. Thus, only the side frequency markers which correspond to the selector signal level Vk are displayed by display 30. Due to the action of full-wave rectifier 40, a pair of side frequency markers will be displayed, arrayed symmetrically with respect to the center frequency $F_o$.

Figure 7:
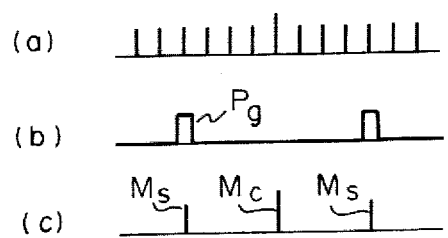
FIG. 7 is a diagram illustrating the manner in which particular frequency markers are selected by the method of the present invention.

FIG. 7 is a diagram illustrating the manner in which a particular pair of side frequency markers are selected and displayed by the present invention. Shown at (a) in FIG. 7 is the appearance of a display provided by a conventional type of frequency marker display system, in which a number of side frequency markers appear on each side of a center frequency marker. With the present invention, as in indicated at (b) of FIG. 7, gate pulses Pg are produced, at timings in relation to the frequency variation of the sweep signal such as to overlap the occurrence of a pair of side frequency markers designated as Ms in (c) of FIG. 7, i.e. only the side frequency markers Ms are selected to be displayed together with the center frequency marker Mc.

Figure 8:
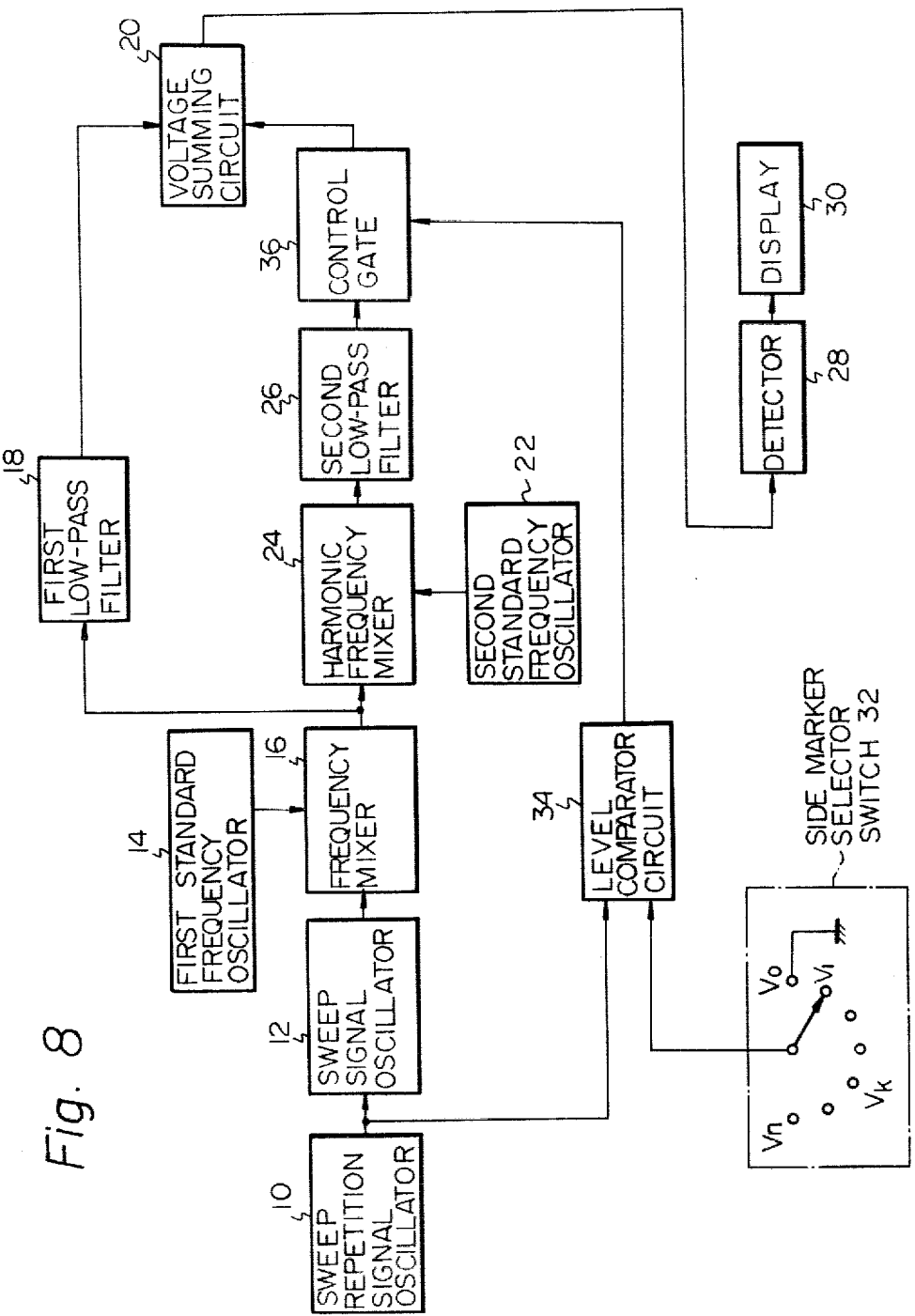
FIG. 8 is a block diagram of a second embodiment of a frequency marker display system according to the present invention.

A second embodiment of a frequency marker display system according to the present invention is shown in FIG. 8. In this case, control gate 36 is connected between low-pass filter 26 and voltage summing circuit 20. The function of control gate 36 is identical to that of the first embodiment in FIG. 4, i.e. to enable only the side frequency markers which correspond to the selector voltage from side marker selector switch 32 to be displayed on display 30, together with the center frequency marker, by the action of gate pulse Pg. It will be apparent that the control gate 36 may also be inserted in various other positions, in the signal path from harmonic frequency mixer 24 to voltage summing circuit 20, to achieve the same effect.

From the above description, it will be apparent that the present invention enables one or more side frequency markers to be selectively displayed together with a center frequency marker, with the selection of frequency markers corresponding to known frequencies within the sweep range of a sweep signal being performed by an operator through actuation of a selector switch. It will be clear that the present invention provides an extremely simple and effective frequency marker display system of improved design, which offers significant advantages of convenience and ease of operation as compared with conventional frequency marker display system in which a large number of side frequency markers indicating various different frequencies of a sweep signal are displayed simultaneously.

It should be noted that various changes and modifications to the described embodiments of the present invention which fall within the scope claimed for the present invention. As an example, the method whereby a gate pulse Pg is produced may be modified in various ways. Such as by utilizing a monostable multivibrator which is triggered to produce a gate pulse when the sweep repetition signal attains a certain level (i.e. level Vk−dE shown in FIG. 6), or by triggering a bistable circuit appropriately when the sweep repetition signal is detected to attain certain levels (i.e. levels Vk−dE and Vk+dE in FIG. 6). The description of the preferred embodiments should therefore be interpreted in an illustrative and not in a limiting sense.

What is claimed is:

1. In a frequency marker display system having a display device and means for indicating on said display device a marker indicative of a center frequency and a plurality of markers indicative of side frequencies which are lower and higher than said center frequency, said indicating means including a sweep repetition oscillator for producing a sweep repetition signal, a sweep signal oscillator for producing a sweep signal whose frequency varies about said center frequency in a periodically repetitive manner, a first standard frequency oscillator for producing an output signal at said center frequency, a frequency mixer coupled to receive said output signals from said sweep signal oscillator and said first standard frequency oscillator for producing an output signal at zero frequency when said sweep signal oscillator output signal attains said center frequency, a first low-pass filter coupled to receive an output from said first low-pass filter to produce an output signal when said center frequency is attained by said sweep signal oscillator, a second standard frequency oscillator, a harmonic frequency mixer coupled to receive an output signal from said standard frequency oscillator and said frequency mixer for producing an output signal containing frequency components comprising the sum and difference frequencies of said output signal from second standard frequency oscillator and a plurality of harmonics thereof with said output signal from said frequency mixer, a second low-pass filter coupled to receive said output from said harmonic frequency mixer to produce an output signal to indicate one of said side frequencies when the frequency of said output signal from said frequency mixer coincides with the frequency of said output signal from said second standard frequency oscillator and with said harmonics thereof, means for producing a signal which is the sum of said signals from said first and second low-pass filters, an output from said summing means being applied to said display device to cause said frequency markers to be displayed, the improvement comprising:

side marker voltage selector switch means operable to selectively produce an output signal at each of a plurality of voltage levels, each of said voltage levels corresponding to a level of said output signal from said sweep repetition oscillator at which a frequency corresponding to one of said side frequencies is generated by said sweep oscillator;

level comparator circuit means for comparing the amplitude of said output signal from said side marker voltage selector switch means with the amplitude of said output signal from said sweep repetition oscillator and for generating an output signal when coincidence between said amplitudes is detected; and control gate means connected in the circuit path between said second standard frequency oscillator, said harmonic frequency mixer, said second low-pass filter and said signal summing means, and responsive to said output signal from said level comparator circuit means for enabling the application of an output signal from said second low-pass filter to said signal summing means;

whereby at least one selected side frequency marker corresponding to the output signal from said side marker voltage selector switch means is indicated on said display device, while all other ones of said side frequency markers are inhibited from being so indicated.

2. A frequency marker display system according to claim 1, wherein said level comparator circuit means comprise:

means for adding a predetermined voltage increment to said output signal from said side marker voltage selector switch means to produce a first threshold level signal;

means for subtracting a predetermined voltage increment from said output signal from said side marker voltage selector switch means to produce a second threshold level signal; and gate pulse generation means for detecting when the level of said sweep repetition signal attains said first threshold level and responsive thereto for initiating the leading edge of a gate pulse, and further for detecting when the level of said sweep repetition signal attains said second threshold level and responsive thereto for initiating a trailing edge of said gate pulse.

3. A frequency marker display system according to claim 2, wherein said level comparator circuit comprises:

a full-wave rectifier circuit coupled to rectify said sweep repetition signal;

a voltage summing circuit for adding a predetermined DC voltage increment to said output signal from said side marker voltage selector switch means;

a voltage subtraction circuit for subtracting said predetermined DC voltage increment from said output signal of said side marker voltage selector switch means;

a first comparator for detecting a condition in which the level of a full-wave rectified sweep repetition signal from said full-wave rectifier circuit is lower than the level of an output signal from said voltage summing circuit and for producing an output signal at a first potential when said condition is detected, and for detecting a condition in which the level of said full-wave rectified sweep repetition signal is higher than the level of said voltage summing circuit output signal and producing an output signal at a second potential when said latter-mentioned condition is detected;

a second comparator for detecting a condition in which the level of said full-wave rectified sweep repetition signal is lower than the level of an output signal from said voltage subtraction circuit and for producing an output signal at said second potential when said condition is detected, and for detecting a condition in which the level of said full-wave rectified sweep repetition signal is higher than said level of said output signal from said voltage subtraction circuit, and for producing an output signal at said first potential when said latter-mentioned condition is detected; and logic circuit means coupled to receive said output signals from said first and second comparators, and responsive thereto for producing an output signal at said first potential level while both of said output signals from said first and second comparators are at said first potential level, and for producing an output signal at said second potential level while either of said output signals from said first and second comparators is at said second potential level;

said logic circuit means thereby producing an output pulse at said first potential level during intervals which overlap time intervals in which said at least one selected side frequency marker is indicated on said display device, said logic circuit output pulse constituting said output signal from said level comparator circuit means.

* * * * *